United States Patent [19]
Orcutt

[11] Patent Number: 5,858,940
[45] Date of Patent: Jan. 12, 1999

[54] PRINTING PLATE IMAGE DELETION COMPOSITION

[76] Inventor: James L. Orcutt, 248 129th Ave., Bellevue, Wash. 98005

[21] Appl. No.: 851,929

[22] Filed: May 6, 1997

Related U.S. Application Data

[63] Continuation-in-part of Ser. No. 637,921, Apr. 30, 1996, abandoned.

[51] Int. Cl.⁶ ................................................. C09D 10/00
[52] U.S. Cl. ........................ 510/171; 430/331; 430/329; 510/257; 510/202; 510/176; 510/206
[58] Field of Search ................................. 430/331, 329; 510/257, 202, 171, 176, 206

[56] References Cited

U.S. PATENT DOCUMENTS

| | | | |
|---|---|---|---|
| 3,615,445 | 10/1971 | Powell | 96/33 |
| 3,944,421 | 3/1976 | Lewis et al. | 96/36 |
| 3,954,468 | 5/1976 | Lewis et al. | 96/33 |
| 4,019,907 | 4/1977 | Tsunoda et al. | 96/75 |
| 4,265,999 | 5/1981 | Schell | 430/189 |
| 4,355,096 | 10/1982 | Walls | 430/302 |
| 4,695,327 | 9/1987 | Grebinski | 134/11 |
| 4,738,732 | 4/1988 | Anderson et al. | 148/23 |
| 5,091,053 | 2/1992 | Blonder et al. | 456/657 |
| 5,213,950 | 5/1993 | Dooley | 430/309 |

*Primary Examiner*—Cynthia Hamilton
*Attorney, Agent, or Firm*—Ray G. Wilson

[57] ABSTRACT

A hardened image is removed from printing plates by a solution of formic acid and hydrofluoric acid. In one embodiment, the solution further includes a buffer solution to maintain the oleophilic properties of the substrate for printing.

3 Claims, No Drawings

PRINTING PLATE IMAGE DELETION COMPOSITION

This is a continuation-in-part from patent application Ser. No. 08/637,921, filed Apr. 30, 1996 now abandoned.

BACKGROUND OF THE INVENTION

This invention relates to printing plates and, more particularly, to the removal of hardened images from printing plates.

A printing plate is prepared for printing by coating an aluminum substrate with a light sensitive film. If the plate is a "negative" plate, the coating hardens when exposed to ultraviolet light; the coating softens for a "positive" plate. The softened areas are then removed by a specific chemical developer, usually an alkaline base product, and the underlying substrate is ink receptive and ready for printing operations.

In some instances, however, there is an error in the image that has been formed on a plate, or it is desired to alter the image for some reason. A new plate might be used to create the new image. but as it desirable to delete the error and correct the image that has been formed so that the entire process does not have to be repeated. It will be appreciated that any image deletion material must completely remove the hardened emulsion in the area to be corrected and to leave the substrate surface prepared for printing. Aluminum plates have an anodized surface that is damaged by some error deletion compounds; some compounds also change the hydrophilic and oleophilic (ink receptive) characteristics of the aluminum plate. Such changes effect the capability of the aluminum plate to produce images of acceptable quality.

There are a number of different imaging processes and plates, e.g., long run plates, fast exposure plates, and laser plates. Also, computer-to-plate (CTP) technology enables a printer to go directly from the copy to an aluminum printing plate. To realize the cost and labor savings of CTP technology, there is a need to delete image errors on the plate in the press. Existing correction solutions do not adequately remove the hardened image material from these plate and do not remove the image in a time compatible with a production environment.

Accordingly, it is an object of the present invention to provide an image deletion solution that is effective to remove hardened images from printing plates without affecting the printing properties of the plates.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise an image deletion composition for removing hardened image portion from printing plates, including a solution of formic acid and hydrofluoric acid. In one embodiment, the solution further includes a buffer solution to prepare the exposed substrate for printing.

DETAILED DESCRIPTION OF THE INVENTION

In accordance with the present invention, an image deletion composition is provided for removing hardened images from printing plates so that the plates may be reused. Formic acid is the main component for removing the hardened image. The action of the formic acid is enhanced by including hydrofluoric acid with the formic acid. In a preferred embodiment, a buffer solution is added to the composition to lessen the affect of the acid on the ink receptive properties of the underlying substrate.

A preferred composition is formed with isopropyl alcohol to serve as a drying agent on the plate surface and to prevent freezing of the solution during storage and transport. Thus, a 500 ml volume of image deletion solution may be formed as the following exemplary formulation:

| INGREDIENT | MILLILITERS | STRENGTH* | SOURCE |
| --- | --- | --- | --- |
| Hydrofluoric acid | 150 | 48% HCl | Integra Chemical Co., Renton, WA |
| Formic Acid | 150 | 88% formic acid | Integra Chemical |
| Isopropyl Alcohol | 50 | 100% | Integra Chemical |
| Nonoxynol-9 | 50 | 100% | Integra Chemical |
| Phosphoric acid | 25 | 75% | Integra Chemical |
| Hydrogen Peroxide | 25 | 10% | Integra Chemical |
| Sodium Silicate | 25 | 40 degree, Be | Integra Chemical |
| Alkaline-iodide-azide | 25 | 100% | Integra Chemical |

*Balance of solution is water

The phosphoric acid, nonoxynol-9, hydrogen peroxide, sodium silicate, and alkaline-iodide-azide form an exemplary buffer solution. The buffer solution lessens the affect of the formic acid and hydrofluoric acid on the ink receptive properties of the aluminum plate.

It will be appreciated that the composition of the above formulation is not critical and various combinations of formic acid and hydrofluoric acid may readily be found that are effective to remove hardened image portions from the aluminum plate. The preferred range of 88% formic acid is at least 20% by volume. The concentrations of the remaining ingredients can effect the speed of performance of the solution, but not the efficacy of the error correction.

The solution is preferably applied using a felt tip pen. The solution is applied to the image area that is to be deleted using a shaped tip selected for the configuration of the image error. The solution is applied to the plate and then merely wiped off to prepare the corrected area for printing.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An image deletion composition for removing hardened images from printing plates, comprising:

formic acid in the range of 20–30% by volume of an 88% aqueous solution of formic acid; and a balance comprising hydrofluoric acid and water.

2. An image deletion composition for removing hardened image portions on printing plates comprising:

| | |
|---|---|
| Formic acid | 30% by volume of 88% solution |
| Hydrofluoric acid | 30% by volume of 48% solution |
| Isopropyl alcohol | 10% by volume of 100% solution |
| Buffer solution | Balance |

3. An image deletion composition according to claim 2, wherein said buffer solution is formed from nonoxynol-9, phosphoric acid, hydrogen peroxide, sodium silicate, and alkaline-iodide-azide.

* * * * *